(12) United States Patent
Kawamura

(10) Patent No.: US 6,730,368 B1
(45) Date of Patent: May 4, 2004

(54) METHOD OF PREPARING A POLY-CRYSTALLINE SILICON FILM

(75) Inventor: Shinichi Kawamura, Saitama-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/468,217

(22) Filed: Dec. 20, 1999

Related U.S. Application Data

(63) Continuation-in-part of application No. 09/152,256, filed on Sep. 14, 1998, now Pat. No. 6,099,918.

(30) Foreign Application Priority Data

Sep. 25, 1997 (JP) ............................................. 9-260303

(51) Int. Cl.$^7$ ............................................. C23C 16/24
(52) U.S. Cl. .................... 427/554; 427/578; 427/397.7; 427/25.5
(58) Field of Search ................................ 427/554, 578, 427/397.7, 255.5

(56) References Cited

U.S. PATENT DOCUMENTS 5,766,344 A * 6/1998 Zhang et al.

FOREIGN PATENT DOCUMENTS

JP 07221035 * 8/1995

* cited by examiner

*Primary Examiner*—Timothy Meeks
(74) *Attorney, Agent, or Firm*—Pillsbury Winthrop LLP

(57) ABSTRACT

A method of preparing a poly-crystalline silicon (p-Si) film is provided with efficient dehydrogenation treatment of an amorphous silicon (a-Si) film deposited by a plasma enhanced chemical deposition (PECVD) process. A substrate is received in a process chamber of a PECVD system. A plasma discharge takes place to deposit an a-Si film on the substrate in an atmosphere in which reactive and carrier passes are supplied to the chamber. The substrate is still left in the chamber to carry out dehydrogenation of the a-Si film after the same is deposited on the substrate. While the carrier gas is supplied to the chamber during the leaving period of time, the pressure of the chamber is set higher than during the leaving period of time. The pressure of the chamber is set higher than during the deposition the pressure of the chamber is set higher. After the dehydrogenation treatment, the substrate is taken out from the chamber. $XeCl_3$ excimer laser beams are then used to irradiate the a-Si film to change it into a p-Si film.

12 Claims, 4 Drawing Sheets

METHOD OF PREPARING A POLY-CRYSTALLINE SILICON FILM

This is a Continuation-in-part of National Application Ser. No. 09/152,256 filed Sep. 14, 1998 now U.S. Pat. No. 6,099,918.

BACKGROUND OF THE INVENTION

The invention relates to a method of preparing a poly-crystalline silicon film, and, more particularly, a method of preparing a poly-crystalline silicon film by a dehydrogenation treatment of amorphous silicon deposited by a plasma chemical vapor deposition process.

Amorphous silicon thin film transistors (a-Si TFTs) have been used in conventional liquid crystal display devices as pixel switching elements. The a-Si TFT includes an active layer made of the a-Si film that can be uniformly deposited at a relatively low temperature on a glass substrate by a plasma-enhanced chemical vapor deposition (PECVD) process. The glass substrate, which has a lower heat-resistance, is suitable for making a display region larger in area.

Driver-circuit integrated-type liquid crystal display devices have been recently developed. In this type of liquid crystal display device, driver circuits are disposed surrounding the display region (pixel region) on the same substrate as the pixel switching elements. TFTs are also used for the driver circuits in addition to the switching elements. TFTs for the driver circuits especially require a high-speed response characteristic. Since poly-crystalline silicon (p-Si) films are remarkably higher immobility than a-Si films, p-Si TFTs with active layers made of p-Si films are used for the driver-circuit integrated-type liquid crystal display devices.

Poly-crystalline silicon films are usually formed in the following way. First, an a-Si film is deposited on a glass substrate by a PECVD process. Next, a dehydrogenation treatment is carried out on the a-Si film. In the dehydrogenation treatment, the glass substrate upon which the a-Si film is deposited is received in a heating chamber in a low pressure atmosphere and is annealed at a lower temperature (e.g., 400° C. through 500° C.) than a heat-resistance temperature of the glass substrate. The dehydrogenation treatment discharges hydrogen from the a-Si film. Finally, an excimer laser beam is used to irradiate the a-Si film, melting and resolidifying the a-Si film and changing it into a p-Si film.

The a-Si film deposited on the substrate by the PECVD method contains a great quantity of hydrogen. When laser beams are used to irradiate the a-Si film without the dehydrogenation treatment, hydrogen is discharged so abruptly from it that a phenomenon called "ablation" takes place, forming detects in the p-Si film.

Conventionally, a heating chamber or furnace is separately provided for the dehydrogenation treatment in addition to a PECVD system. The dehydrogenation treatment in the heating chamber takes a rather long time, for example, up to several hours including heating and cooling time of the glass substrate. Further, the glass substrate with the a-Si film is washed before dehydrogenation treatment because the substrate is exposed in the atmosphere between the PECVD process and the heating chamber.

Because of the background stated above, the dehydrogenation treatment for the a-Si film in the production process of the p-Si film has been one of the critical factors hindering the productivity of p-Si films.

SUMMARY OF THE INVENTION

An object of the present invention is to provide efficient dehydrogenation treatment for an a-Si film deposited by a PECVD process to produce a p-Si film.

In a method of preparing a p-Si film of the invention, a glass substrate is placed in a process chamber of a PECVD system. Plasma discharge is performed in an atmosphere of reactive and carrier gases in the chamber to deposit an a-Si film on the substrate. When the a-Si film has been deposited on the substrate, the pressure of the chamber is reduced with respect to the atmospheric pressure but the substrate is left in the chamber to perform dehydrogenation treatment for the a-Si film. After the dehydrogenation treatment is complete, the substrate is taken out from the chamber. Laser beams irradiate the a-Si film on the substrate, transforming it into a p-Si film.

According to the method of preparing the p-Si film of the present invention, after the a-Si film is deposited on the substrate, the dehydrogenation treatment is continuously carried out while the substrate is kept in the reaction chamber. Since the substrate is heated sufficiently when the a-Si film is deposited on the substrate, it is unnecessary to heat the substrate again before executing the dehydrogenation treatment. Cooling treatment of the substrate is conducted after completion of the dehydrogenation treatment. Thus, time required for reheating and recooling the substrate in the conventional method can be reduced in the method of the present invention. In addition, since the substrate is not exposed to the atmosphere between the deposition and dehydrogenation treatments, it is not necessary to wash the substrate before the dehydrogenation treatment. As a result, the total processing time in the method of the present invention can be shortened significantly.

Preferably, after the a-Si film is deposited on the substrate in the process chamber of the PECVD system, the substrate remains in the process chamber to carry out the dehydrogenation treatment while the carrier gases are supplied to the chamber. Further, after the a-Si film deposition process, the substrate is kept in the chamber at a pressure that is set higher than the pressure of the deposition process. Generally, the dehydrogenation treatment is carried out more efficiently as its temperature rises. If the flow of gases remains unchanged with the substrate in the chamber and the pressure of the chamber is set higher than the pressure of the deposition process, the temperature of the substrate rises rapidly and the hydrogen is discharged from the a-Si film.

Preferably, after the deposition of the a-Si film, the substrate is left in the chamber and the output power of a heater for the substrate is kept the same as during the deposition process. If, at the time the process is changed from the PECVD to the dehydrogenation, the pressure of the chamber is set higher than during the PECVD process, the flow of gases is unchanged in the chamber, and the output power of the heater is maintained, the adjustment time for the temperature in the chamber to start the next PECVD process can be shortened.

Furthermore, preferably, the substrate temperature at the deposition process is set at 400° C. or more. The period of time t (seconds) during which the substrate is left in the chamber is set to satisfy the following equation (1):

$$t > d^2/(A \times \exp B) \qquad (1)$$

where
$A = 6.0 \times 10^{14}$,
$B = -2.56 \times 10^{-19}/(k \times (273 + \theta))$,
$k = 1.38 \times 10^{-23}$,
d (angstroms) is the thickness of the a-Si film and
θ is the substrate temperature when the substrate is left in the chamber.

Equation (1) can be derived from the following theory. The rate of the dehydrogenation can be determined by the diffusion of hydrogen in the a-Si film. When the root mean square diffusion length of hydrogen "λ" is greater than the thickness "d" of the a-Si film, dehydrogenation can be brought about. Where the diffusion coefficient is D (cm²/sec) in the a-Si film and the leaving period of time is t (sec), the root mean square diffusion length λ (cm) during the leaving period of time is given by the following equation:

$$\lambda = (2 \times D \times t)^{+1/2}$$

The above stated condition (i.e., the relationship between the thickness d (angstroms) of the a-Si film and the root mean square diffusion lengths (cm)) can be expressed by the following equation:

$$d < (2 \times D \times t)^{+1/2} \times 10^8$$

From that equation, the leaving period of time required for efficient dehydrogenation treatment is expressed by equation (2):

$$t > d^2 / (10^{16} \times 2 \times D) \qquad (2)$$

where
  D=Do×exp (−Ed/kT),
  Do=3×10⁻² (cm²/sec),
  Ed=1.6×1.60×10⁻¹⁹ (J),
  Ed: hydrogen diffusion energy (1.6 eV),
  T: temperature (K) of the a-Si film, and
  k: Boltzmann's constant (1.38×10⁻²³ J/K).

Inserting these values into equation (2) results in equation (1). The method of the present invention is carried out particularly effectively when a single substrate processing type PECVD system with a small heat capacity is employed.

According to the present invention, a p-Si thin film manufacturing process time can be greatly saved as set forth hereinafter.

First, a method of preparing a p-Si film of the present invention includes the steps performed in a PECVD system in which a PECVD process is carried out to form an a-Si film on a glass substrate. The reaction chamber of the process is heated to a temperature of 400° C. or higher. Dehydrogenation remarkably takes place in the chamber in that temperature range. The substrate is then taken out from the reaction chamber and is received and maintained in a heating chamber for further dehydrogenation treatment. A period of processing time necessary for post-heating the substrate for such further dehydrogenation treatment can be shortened more effectively than the time necessary for conventional processes in which dehydrogenation treatments are conducted in separate heating chambers provided independently from a PECVD system.

Second, it is substantially sufficient to perform a cooling treatment only once after the dehydrogenation. As a result, reheating and recooling time periods can be decreased relative to conventional processes.

Third, substantially no substrate washing treatment is needed because the substrate is not exposed to air after the completion of a-Si film forming.

Finally, it brings about an additional time saving effect for dehydrogenation because a hydrogen content in an a-Si film is reduced from the beginning of a film forming process due to a glass substrate kept at 400° C. or higher.

The above-stated ends, other objects, and technical features of the present invention will become apparent from the following description when taken with the accompanying drawings. It will be understood, however, that the drawings are for purposes of illustration and are not to be construed as defining the scope of the invention, reference being had for the latter purpose to the claims appended hereto.

DETAILED DESCRIPTION OF THE INVENTION

A specific embodiment of the invention is explained with reference to FIG. 1. However, the claims are not limited to the details described with respect to this embodiment. As shown in FIG. 1 (a), a silicon oxide layer 2 with a thickness of 1,000 angstroms is formed on a glass substrate 1 by a PECVD process. Amorphous silicon films 3 are deposited on the Be silicon oxide layer 2 by a single substrate processing type capacitively-coupled PECVD system. The process conditions are: the flow ratio $SiH_4/Ar$ is 1/20; the pressure of the process chamber is 1 Torr; the RF output is 100 W; the gap between electrodes is 25 mm; the temperature of the substrate is 420° C.; and the deposition rate is 700 angstroms/min.

When the thickness of the a-Si film 3 has reached a predetermined value, the RF output is turned off and the supply of $SiH_4$ is stopped. After the completion of the PECVD process, the output of a heater is kept constant. In this situation, the pressure in the chamber is raised to 4 Torr, the substrate is left in the chamber, and the dehydrogenation of the a-Si film 3 is carried out. After a predetermined period of time has lapsed (described below), the substrate is taken out from the chamber.

Figure 1A:
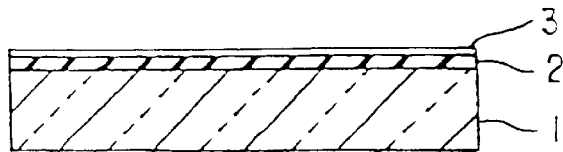
FIGS. 1(a) and 1(b) are drawings depicting a sectional view of an a-Si film substrate device and a p-Si film substrate, respectively.
Figure 1B:
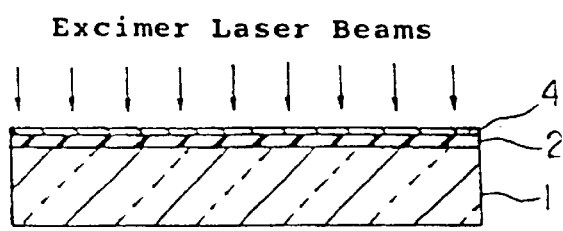

As shown in FIG. 1(b), XeCl excimer laser beams (λ=308 nm: pulsed oscillation) irradiate the a-Si film 3 on the substrate 1, melting the a-Si film which is solidified as the p-Si film 9 at the end of the process.

Figure 2:
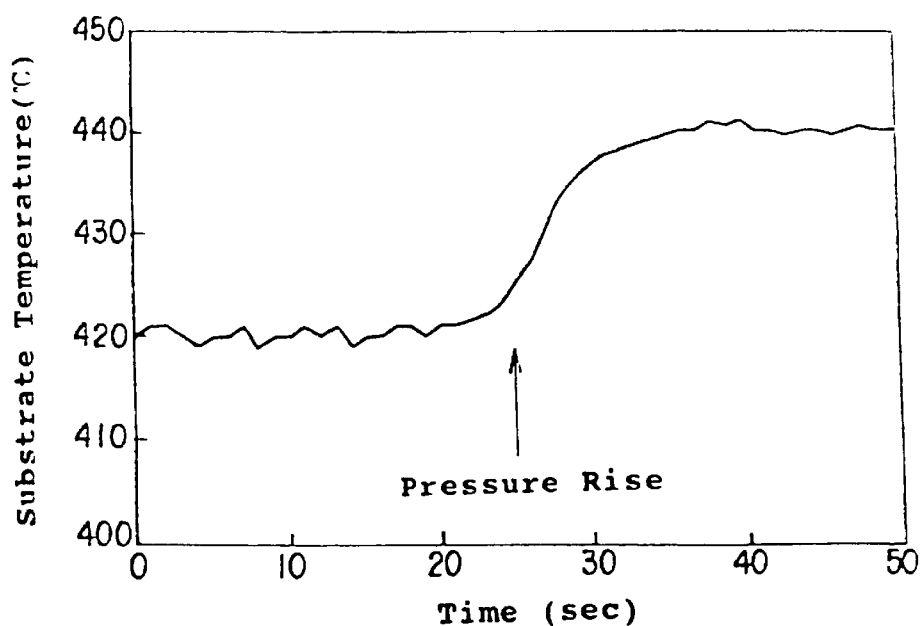
FIG. 2 is a graph depicting temperature changes in the substrate when the process transfers from the CVD treatment under a pressure of 1 Torr in the reactive chamber to the dehydrogenation treatment under a pressure of 4 Torr therein.

FIG. 2 shows measured data of temperature changes in the substrate during the transfer from the PECVD process to the dehydrogenation process. As shown in FIG. 2, when the pressure in the chamber rises from 1 Torr (SiH$_4$/Ar are supplied) to 4 Torr (Ar is supplied), the temperature of the substrate varies from about 420° C. to about 440° C.

In order to shorten the leaving period of time after the completion of the PECVD process, the temperature of the substrate is set high enough to reduce the hydrogen content in the a-Si film. As described above, after the deposition of the a-Si films by the PECVD process, the substrate is left under higher pressure than during the deposition process so that the temperature of the substrate becomes higher than it was during the deposition process, discharging the hydrogen in short time.

The method explained above is particularly effective in the case of a single substrate processing type PECVD system. Since the substrate is treated one sheet at a time, the system heating capacity is small. Thus, when the substrate is left in the chamber after the deposition of the a-Si films, the temperature in the chamber increases greatly as the pressure is set higher and the gas flow is kept substantially constant.

Figure 3:
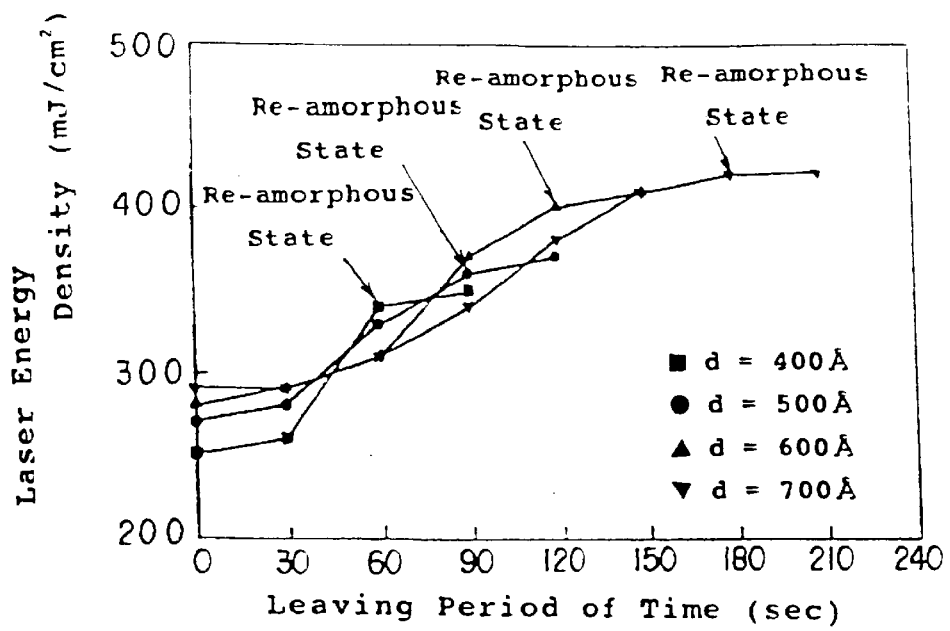
FIG. 3 is a graph depicting a characteristic curve indicating the relationship between the period of time during which the substrate is left in the chamber after the deposition of a-Si films and energy densities of excimer laser irradiation at which ablation takes place in the films.

FIG. 3 indicates the relationship between the period of time during which the substrate is left in the chamber after the deposition of a-Si films in the PECVD process and energy densities of excimer laser irradiation at which ablation takes place in the films. The thickness of the a-Si film (400–700 angstroms) is a parameter in FIG. 3.

As apparent from FIG. 3, when the substrate has been left for a couple of minutes after the completion of the PECVD process, the energy density to cause the ablation increases in value every thickness of the films from 400 angstroms through 700 angstroms. The tolerance to ablation is improved.

When laser irradiation is carried out to form a poly-crystalline silicon film from an a-Si film, the crystal grain size usually becomes larger as the energy density of the laser increases. However, when the energy density becomes too large, reformation of an a-Si film takes place, resulting in a small grain size. Thus, if the energy density of the laser irradiation is less than the energy density that reforms the a-Si film and no ablation occurs, the tolerance to the laser irradiation is sufficient. FIG. 3 also indicates the energy density for each thickness of the film at which reformation of the a-Si film takes place.

Figure 4:
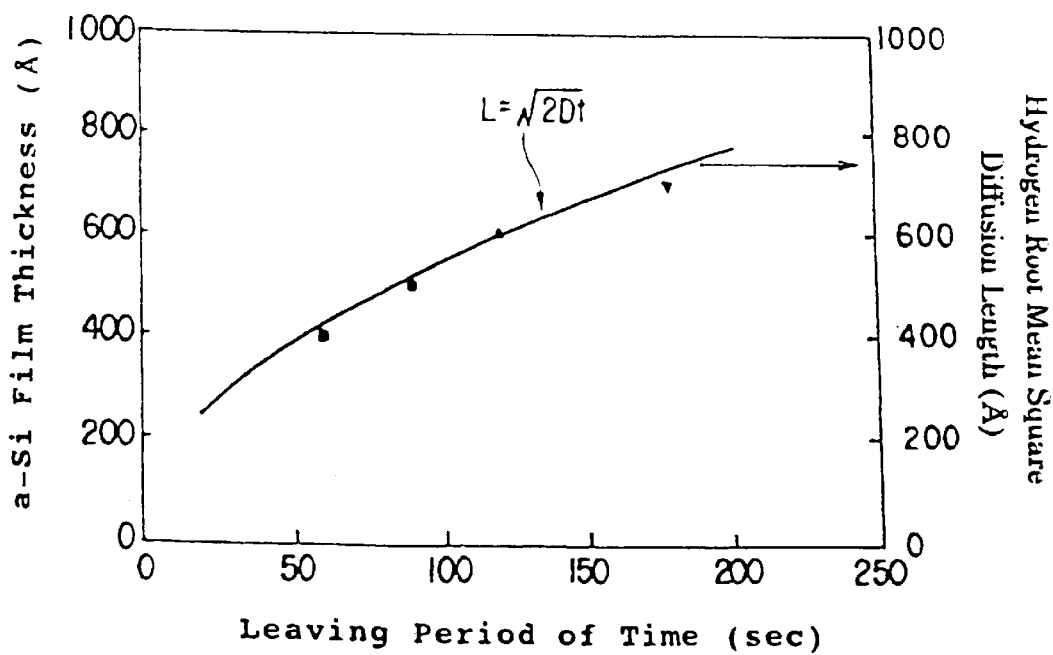
FIG. 4 is a graph depicting a characteristic curve for IV the relationship between the period of time t (the horizontal axis) during which the dehydrogenation is required to avoid ablation at a lower energy density than reformation of an a-Si film and the thickness d (the vertical axis) thereof, and the root mean square diffusion length L of hydrogen in the a-Si film every leaving period of time.

Based upon the data depicted in FIG. 3, FIG. 4 is a characteristic curve showing the relationship between the thickness d (angstroms) of a-Si films and the leaving period of time t (second) required for the dehydrogenation with avoidance of ablation at a lower energy density than reformation of the a-Si films.

Where the diffusion coefficient is D (cm$^2$/sec) in the a-Si film and the leaving period of time is t (sec), the root mean square diffusion length λ (cm) during the leaving period of time is given by the following equation:

$$\lambda = (2 \times D \times t)^{+1/2}$$

where

D=Do×exp (−Ed/kT)
Do=3×10$^{-2}$ (cm$^2$/sec)
Ed=1.6×1.60×10$^{-19}$ (J)
k=1.38×10$^{-23}$ (J/K)
Ed: hydrogen diffusion energy (1.6 eV), T: temperature (K) of the a-Si film, and
k: Boltzmann's constant.

Thus, the root mean square diffusion length L (angstroms) of hydrogen is given by the following equation:

$$L = (A \times t \times \exp B)^{+1/2}$$

where $$A = 6.0 \times 10^{14},$$

and $$B = -2.56 \times 10^{-19}/(k \times (273+\theta))$$

FIG. 4 also indicates the root mean square diffusion length L (the right axis) with respect to each leaving time t (the X-axis). If the root mean square diffusion length of hydrogen is larger than the thickness d of the a-Si film during the leaving period of time, no ablation takes place at the energy density lower than the energy density for reformation of the a-Si films. Sufficient tolerance to laser ablation can be obtained.

When the substrate temperature during the PECVD process is more than 400° C. and the hydrogen content is originally low, tolerance to the laser irradiation at the poly-crystallization treatment can be secured if the root mean square diffusion length of hydrogen in the a-Si film is larger than the thickness thereof during the leaving period of time by satisfying the following equation:

$$(A \times t \times \exp B)^{+1/2} > d$$

Thus, the necessary leaving period of time is given by the following equation:

$$t > d^2/(A \times \exp B)$$

One example of manufacturing processes for a p-Si TFT is explained with reference with FIGS. 5(a) through FIG. 5(g). The p-Si film is used for the TFT as an active semiconductor layer.

Figure 5A:
FIGS. 5(a) through 5(g) are cross-sectional views of the substrates depicting a series of production processes for a TFT in which the p-Si film of the present invention is used.
Figure 5B:
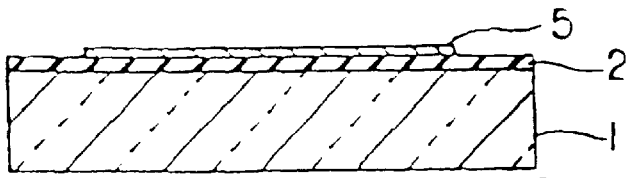

As shown in FIG. 5(a), after a silicon oxide layer 2 and an a-Si layer are deposited on a glass substrate 1, XeCl excimer laser beams irradiate the a-Si layer so that it is poly-crystallized to form a p-Si layer 4 on the silicon oxide layer 2. A photolithography pattern is then applied to make a photoresist pattern on the p-Si layer 4. An etching process of the p-Si layer 4 is carried out to form an island-like p-Si layer 5 as shown in FIG. 5(b).

Figure 5C:
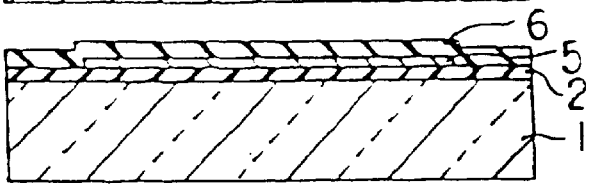

A silicon oxide film 6 having a thickness of 1,000 angstroms is then deposited on the p-Si layer 5 and the silicon oxide layer 2 by the PECVD process to form a gate insulation layer as shown in FIG. 5(c).

Figure 5D:
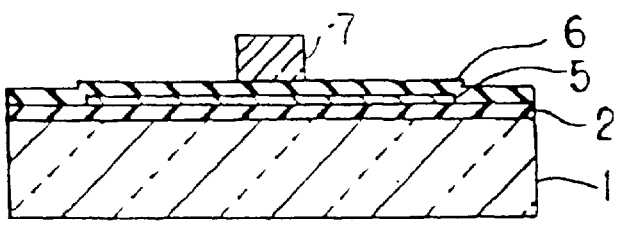

In the next step, an alloy of molybdenum and tantalum is deposited by a sputtering method to a thickness of 3,000 angstroms. As shown in FIG. 5(d), the alloy is processed to form a gate electrode 7 by a patterning method of photolithography.

Figure 5E:
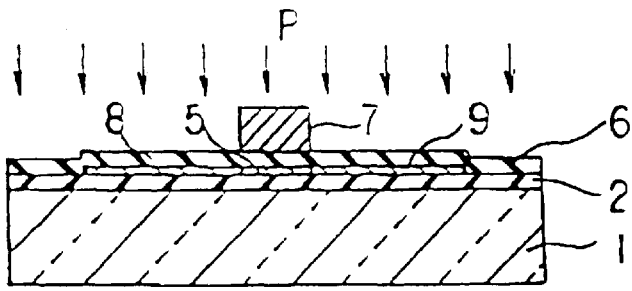

FIG. 5(e) schematically shows ion implantation. A mass separation-type ion implantation system is used to implant an impurity doping material or a dopant (e.g., phosphorus) into the p-Si film through the silicon oxide film 6 and the gate electrode 7 used as a mask. The doped regions form ohmic contacts 8 and 9. A non-mass separation-type ion implantation system may be similarly employed.

Figure 5F:
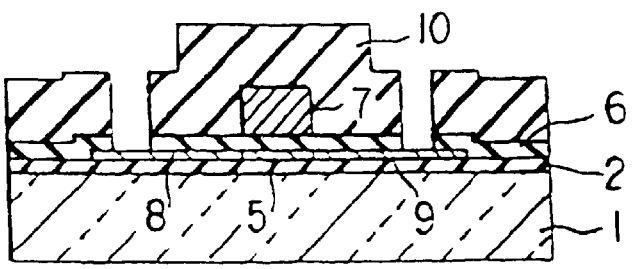
Figure 5G:
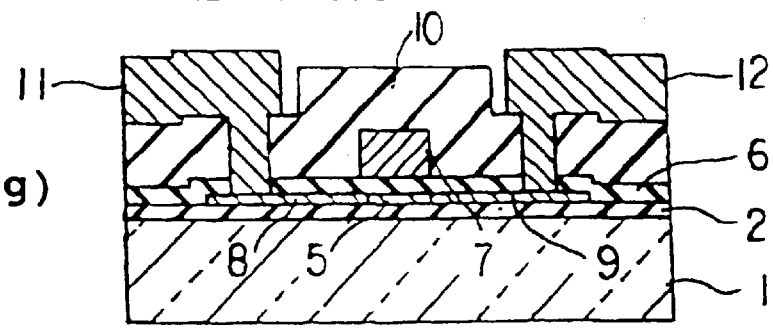

Another silicon oxide film 10 is deposited to form an inter-layer isolation layer with the thickness of 4,000 angstroms by the PECVD method. Excimer laser beams irradiate through the isolation layer 10 to activate the dopant. As shown in FIG. 5(f), the isolation layer 10 is then processed to define contact holes by a patterning method of photolithography.

An alloy of molybdenum and tantalum is deposited to be 4,000 angstroms in thickness on the upper surface of the device shown in FIG. 5(f) by a sputtering method. The alloy is further processed to form source and drain electrodes 11 and 12 by the patterning method of photolithography. The process sequences described above finally produce the TFT which active semiconductor layer is made of the p-Si film.

According to the method of preparing a p-Si film of the present invention, after the a-Si film is deposited on the substrate by the PECVD process, the substrate is left in the reaction chamber for the short period of time so that the dehydrogenation treatment of the a-Si film can be carried out efficiently. As a result, the sufficient tolerance to the laser beam irradiation in the subsequent poly-crystallization process can be obtained and it provides a significant effect on improvement to the productivity of the p-Si film.

In the event, particularly, that the substrate temperature is set at 400° C. or more in the PECVD deposition process of the a-Si film and the chamber pressure during the leaving period of time is set higher than the deposition process, the period of time required for the dehydrogenation treatment can be shortened.

In the method of preparing a p-Si film of this invention, the period of time for dehydrogenation treatment during which the substrate is left in the process chamber is set to satisfy the equation (1). As a result, the root mean square diffusion length of hydrogen in the a-Si film is larger during the leaving period of time then the thickness of the a-Si film, the sufficient tolerance to the laser beam irradiation in the poly-crystallization process can be secured.

Figure 6:
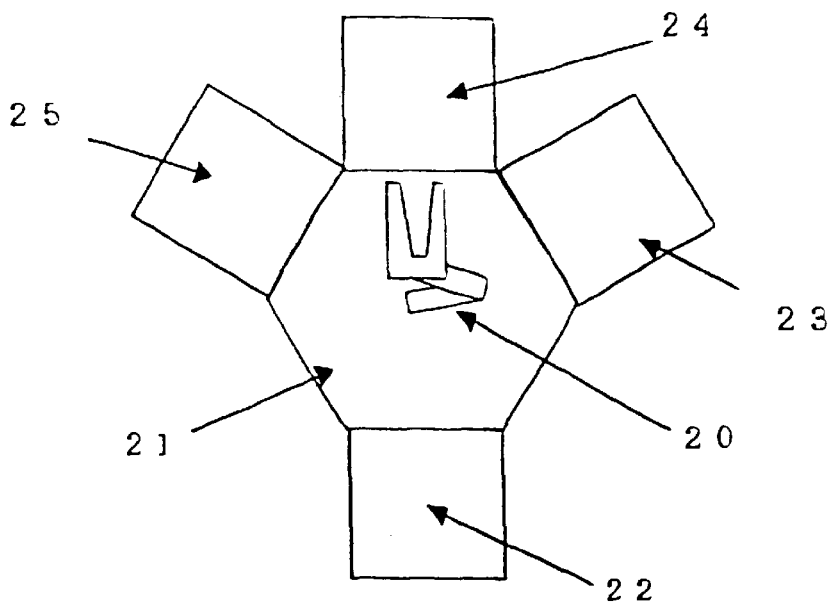
FIG. 6 is a schematic diagram depicting a cluster-type PECVD system to carry out a method of preparing a poly-crystalline silicon film.

FIG. 6 shows a schematic diagram of a cluster-type PECVD system to carry out a method of preparing a poly-crystalline silicon film. Such a cluster-type PECVD system, per se, is well known by those skilled in the semiconductor process field. The cluster-type PECVD system used in this embodiment may be a conventional one which includes a manipulation robot 20, a transition chamber 21, a load-lock chamber 22, a pre-heating chamber 23, a process ("reaction") chamber 24 and a post-heating chamber 25.

The chambers 22 through 25 are provided with partition doors facing the transition chamber 21 to separate each other. The transition chamber 21 is kept evacuated or less than an atmospheric pressure (to be set at 1 Torr in this embodiment) with introduced inert gases. The load-lock chamber 22 receives a glass substrate to be processed from the outside and outputs the same there after the completion of processing. The glass substrate is preliminarily heated prior to depositing a film thereon in the pre-heating chamber 23. An a-Si film is deposited on the substrate in the reaction chamber 24. After the completion of film deposition, the substrate is heated in the post-heating chamber 25 for a dehydrogenation treatment of the a-Si film. Chamber arrangements are not limited to the one set forth above. A plurality of reaction chambers, for instance, may be assigned for the film deposition step and one heating chamber may be used for both pre-heating and post-heating steps.

Next, a series of treatments will be explained in detail with reference to FIGS. 1(a), 1(b) and 6. A glass substrate 1 is carried into the load-lock chamber 22 from the outside. After the load-lock chamber 22 is evacuated, the partition door of the chamber 22 is opened and the robot 20 takes the substrate 1 into the pre-heating chamber 23. After being heated up to 420° C. in the chamber 23, the substrate 1 is carried into the reaction chamber 24. The partition door of the chamber 24 is closed, reaction gasses are introduces in the chamber 24, and the pressure thereof is adjusted to a predetermined value. When the temperature of the substrate 1 is stabilized at 400° C., the chemical vapor deposition is carried out to form a 1,000 angstroms thick $SiO_2$ film 2 on the substrate 1 and then a 500 angstroms thick a-Si film 3 on the $Sio_2$ film 2. In this case, the conditions for forming a-Si film 3 are as follows:

Gas flow ratio $SiH_4/Ar=1/20$;
Pressure of the reaction chamber 24=1 Torr;
RF output power=100W; and
Electrode gap=25mm.

After the completion of forming the 500angstrom thick a-Si film 3, the RF power is turned off, the supply of reaction gasses is stopped, and the reaction chamber 24 is evacuated. The partition door of the chamber 24 is then opened so that the substrate 1 is transferred from the chamber 24 to the post-heating chamber 25 by the robot 20. The temperature of the substrate 1 is 420° C. in the post-heating chamber 25 where the pressure is kept under vacuum or inert gasses are introduced with a reduced pressure (set to be at 4 Torr according to this embodiment). The substrate 1 is left in the post-heating chamber 25 for a period of 15 minutes. The dehydrogenation treatment of the a-Si film 3 is conducted during that period of time. The substrate 1 is then transferred from the chamber 25 to the load-lock chamber 22 by the robot 21. The partition door of the load-lock chamber 22 is closed after the substrate 1 is carried in the chamber 22, the chamber 22 is opened, and the substrate 1 is taken out from the PECVD system.

As shown in FIG. 1(b), excimer laser XeCl beams (308 nm wavelength) are irradiated to melt and resolidify the a-Si film 3 formed on the glass substrate 1. As a result, the a-Si becomes a p-Si film as mentioned above.

Figure 7:
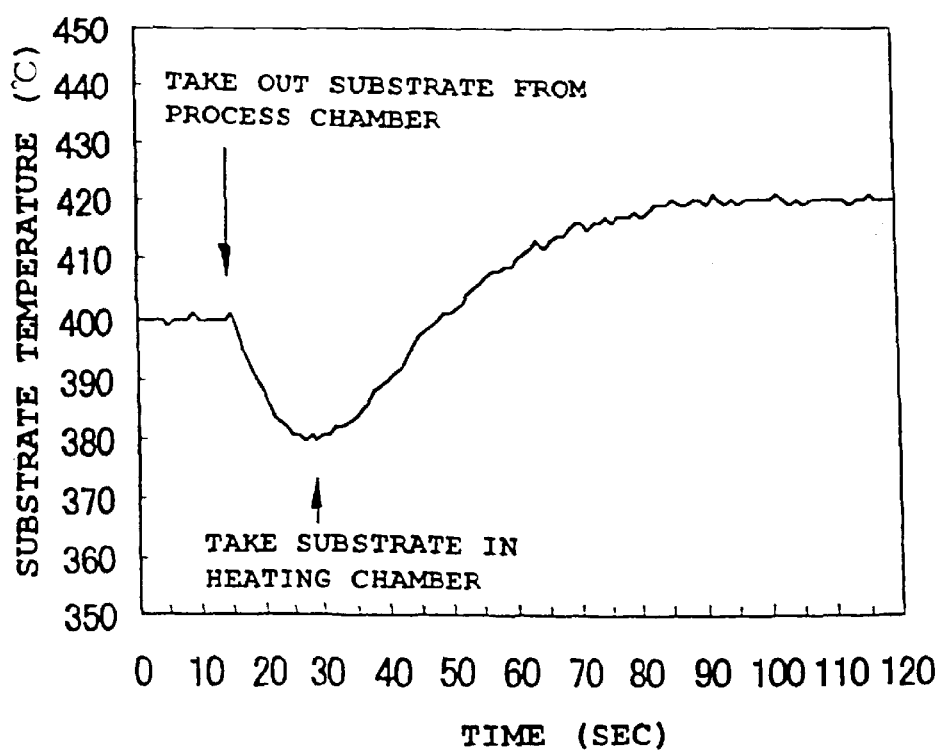
FIG. 7 is a graph depicting the temperature change of the glass substrate when it is transferred from the reaction chamber to the post-heating chamber after the completion of plasma enhanced chemical vapor deposition process.

FIG. 7 shows the temperature change of the glass substrate in the case where the substrate 1 is transferred from the reaction chamber 24 to the post-heating chamber 25 after the completion of plasma enhanced chemical vapor deposition process. While the temperature of the substrate 1 is kept at 400° C. in the reaction chamber 24, it reduces by about 20° C. during the transition period from the reaction chamber 24 to the post-heating chamber 25. Since, however, the substrate 1, per se, is relatively small in heat capacity compared with the entire device, its temperature rises to 420° C. in about 60 seconds after the substrate 1 is taken in the post-heating chamber 25.

Where it is desirable to make the leaving time as short as possible after the completion of plasma enhanced chemical vapor deposition, it is effective that the substrate temperature is kept high at the PECVD film forming step to reduce the hydrogen content in the a-Si film and also at the post-heating treatment. As explained above, it is particularly effective that the substrate temperature is set to be higher at the dehydrogenation treatment of the a-Si film 3 than at the PECVD step for forming an a-Si film.

Since a substrate is processed at a time in the cluster-type PECVD system and such a substrate is smaller in heat capacity than its entire device, it is advantageous that the substrate temperature raises quickly in the post-heating chamber 25 after the PECVD step for forming an a-Si film.

What is claimed is:

1. A method of preparing a poly-crystalline silicon film comprising:
   supplying reactive gases and carrier gases to a process chamber of a plasma chemical deposition system including a substrate;

depositing an amorphous silicon film on the substrate by plasma discharging at a temperature 400° C. or more;

after film deposition, transporting the substrate from the process chamber to a heating chamber attached to the plasma chemical deposition system without exposing the substrate to atmosphere external to the system and holding the substrate in the heating chamber to carry out dehydrogenation treatment of the amorphous silicon film;

removing the substrate from the heating chamber after the dehydrogenation treatment; and irradiating the amorphous silicon film with a laser beam thereby changing the amorphous silicon film into a poly-crystalline silicon film.

2. A method according to claim 1, wherein the temperature of the substrate in the heating chamber is higher than that in the process chamber.

3. A method according to claim 1, wherein the plasma chemical deposition system is a cluster-type plasma chemical deposition system.

4. A method according to claim 1, wherein the depositing step is carried out with reactive and carrier gases supplied to the process chamber and the dehydrogenation treatment is carried out with the carrier gas supplied to the heating chamber.

5. A method according to claim 1, wherein the dehydrogenation treatment is carried out without a reactive gas.

6. A method according to claim 1, wherein irradiating step comprises the step of irradiating with an excimer laser beam.

7. A method according to claim 1, wherein the dehydrogenation treatment reduces the hydrogen content of the amorphous silicon film to less than 10%.

8. A method according to claim 1, wherein a period of leaving time t (seconds) of the substrate in the heating chamber, a thickness d (angstroms) of the amorphous silicon film, and a temperature (° C.) of the heating chamber at the time when the substrate is left in the chamber satisfy the following equation (1):

$$t > d^2/(A \times \exp B) \quad (1)$$

where $$A = 6.0 \times 10^{14},$$

$$B = -2.56 \times 10^{-19}/(k \times (273 + \theta)),$$

and $$k = 1.38 \times 10^{-23}.$$

9. A method according to claim 1, wherein the plasma chemical deposition system is a single substrate processing plasma chemical deposition system.

10. A method according to claim 1, wherein transporting the substrate to the heating chamber is carried out through a path in a nitrogen or inactive gas atmosphere.

11. A method of preparing a thin film transistor comprising:

supplying reactive gases and carrier gases to a process chamber of a plasma chemical deposition system including a substrate;

depositing an amorphous silicon film on the substrate by plasma discharging at a temperature 400° C. or more;

after film deposition, transporting the substrate from the process chamber to a heating chamber attached to the plasma chemical deposition system without exposing the substrate to atmosphere external to the system and holding the substrate in the heating chamber to carry out dehydrogenation treatment of the amorphous silicon film;

removing the substrate from the heating chamber after the dehydrogenation treatment;

irradiating the amorphous silicon film with a laser beam thereby changing the amorphous silicon film into a poly-crystalline silicon film; and forming a thin film transistor including the poly-crystalline silicon as an active semiconductor layer.

12. A method of preparing an active-matrix type liquid crystal display device comprising:

supplying reactive gases and carrier gases to a process chamber of a plasma chemical deposition system including a substrate;

depositing an amorphous silicon film on the substrate by plasma discharging at a temperature 400° C. or more;

after film deposition, transporting the substrate from the process chamber to a heating chamber attached to the plasma chemical deposition system without exposing the substrate to atmosphere external to the system and holding the substrate in the heating chamber to carry out dehydrogenation treatment of the amorphous silicon film;

removing the substrate from the heating chamber after the dehydrogenation treatment;

irradiating the amorphous silicon film with a laser beam thereby changing the amorphous silicon film into a poly-crystalline silicon film; and forming an active-matrix type liquid crystal display device including a thin film transistor formed from the poly-crystalline silicon as an active semiconductor layer.

* * * * *